United States Patent
Shin et al.

(10) Patent No.: US 11,361,984 B2
(45) Date of Patent: Jun. 14, 2022

(54) SUBSTRATE PROCESSING APPARATUS

(71) Applicant: JUSUNG ENGINEERING CO., LTD., Gwangju-si (KR)

(72) Inventors: Seung Chul Shin, Gwangju-si (KR); Jin Hyuk Yoo, Gwangju-si (KR); Min Su Lee, Gwangju-si (KR); Dong Hwan Choi, Gwangju-si (KR)

(73) Assignee: JUSUNG ENGINEERING CO., LTD.

( * ) Notice: Subject to any disclaimer, the term of this patent is extended or adjusted under 35 U.S.C. 154(b) by 765 days.

(21) Appl. No.: 16/328,273

(22) PCT Filed: Aug. 22, 2017

(86) PCT No.: PCT/KR2017/009107
§ 371 (c)(1),
(2) Date: Feb. 25, 2019

(87) PCT Pub. No.: WO2018/043976
PCT Pub. Date: Mar. 8, 2018

(65) Prior Publication Data
US 2020/0335387 A1    Oct. 22, 2020

(30) Foreign Application Priority Data

Aug. 30, 2016 (KR) .................. 10-2016-0110879

(51) Int. Cl.
*H01L 21/687* (2006.01)
*H01L 21/683* (2006.01)

(52) U.S. Cl.
CPC .... *H01L 21/68764* (2013.01); *H01L 21/6833* (2013.01); *H01L 21/68785* (2013.01)

(58) Field of Classification Search
CPC ......... H01L 21/68764; H01L 21/68785; H01L 21/6831; H01L 21/68771; H01L 21/6833
(Continued)

(56) References Cited

U.S. PATENT DOCUMENTS

2013/0134036 A1    5/2013    Liu et al.
2016/0138159 A1*   5/2016    Kato ................... C23C 16/4408
                                                                118/730
2016/0230269 A1    8/2016    Raj et al.

FOREIGN PATENT DOCUMENTS

CN    102534527 A  *  7/2012
JP    2003133233 A     5/2003
(Continued)

OTHER PUBLICATIONS

Written Opinion for PCT/KR2017/009107 dated Nov. 27, 2017.

*Primary Examiner* — Kevin J Comber
(74) *Attorney, Agent, or Firm* — Renaissance IP Law Group LLP (57) ABSTRACT

A substrate processing apparatus may include a first disk provided in a chamber and configured to perform a turning motion and to include a plurality of seating holes periodically arranged within a specific radius from a center axis, a plurality of second disks provided in the seating holes, respectively, and configured to perform a revolving and rotating motion in accordance with the turning motion of the first disk, a first rotary connector structure provided between the second disk and the seating hole to allow for a rotating motion of and for an electric connection to the second disk, an electrostatic chuck provided on the second disk and configured to hold a substrate using an electric power supplied through the first rotary connector structure, and a first magnetic gear fixed to the second disk and configured to exert a torque on the second disk, and a second magnetic gear.

8 Claims, 5 Drawing Sheets

(58) Field of Classification Search
USPC .......................................................... 361/234
See application file for complete search history.

(56) References Cited

FOREIGN PATENT DOCUMENTS

| | | | |
|---|---|---|---|
| JP | 2003347228 A | * | 12/2003 |
| JP | 2003347228 A | | 12/2003 |
| JP | 2011187566 A | | 9/2011 |
| JP | 2013044047 A | | 3/2013 |
| JP | 5276388 B2 | | 8/2013 |
| JP | 2016096220 A | | 5/2016 |
| KR | 20160073281 A | | 6/2016 |

* cited by examiner

SUBSTRATE PROCESSING APPARATUS

CROSS-REFERENCE TO RELATED APPLICATIONS

This application is a continuation of and claims priority to PCT/KR2017/009107 filed on Aug. 22, 2017, which claims priority to Korea Patent Application No. 10-2016-0110879 filed on Aug. 30, 2016, the entireties of which are both hereby incorporated by reference.

BACKGROUND OF THE INVENTION

The present disclosure relates to a substrate processing apparatus, and in particular, to a substrate processing apparatus capable of improving uniformity in a process of processing a plurality of substrates. The substrate processing apparatus includes a main disk, which is configured to execute a turning motion, and an auxiliary disk, which is configured to execute a revolving and rotating motion.

In general, to fabricate a semiconductor memory device, a liquid crystal display device, an organic light emitting device, and so forth, it is necessary to perform a semiconductor fabrication process on a substrate several times. For example, in order to form desired patterns on a substrate, deposition and patterning processes should be repeated several times.

In detail, the semiconductor fabrication process includes a deposition process of forming a thin film on a substrate, a photolithography process of opening a desired region of the thin film, and an etching process of removing the opened region of the thin film. In the semiconductor fabrication process, each process is performed in a process chamber which is prepared to have an optimized process environment.

Generally, an apparatus for processing a circular substrate such as a wafer is placed in a process chamber and is configured to have a circular first disk and a plurality of circular second disks, each having a diameter less than that of the first disk.

In the case where the substrate processing apparatus is used, a substrate processing process includes loading a substrate on the second disk and then injecting a source material onto the substrate while turning the first disk and revolving and rotating the second disk. By repeating the substrate processing process, it is possible to form a structure of a desired shape on the substrate.

Here, an additional component, which is configured to inject the air or any other gas) is used to turn or rotate the second disk around its center (i.e., to realize a rotational motion of the second disk). In this case, a contamination material contained in the air or gas may be adsorbed on the substrate, and this may lead to failure of a semiconductor product.

Korea Patent Publication No. 10-2016-0073281 discloses a way of turning or rotating a circular metal plate by changing a relative position of a magnet with respect to a portion of a peripheral region of the circular metal plate, based on Argo's principle. However, in the turning or rotation of the circular metal plate using the Argo's principle, there is a difficulty in precisely controlling a rotation speed and exactly stopping the circular metal plate at a desired position.

Thus, it is necessary to develop a rotating way of revolving a first disk and stably rotating a second disk equipped to the first disk. Furthermore, it is necessary to develop a method of stably maintaining a position of a substrate loaded on the second disk against a centrifugal force exerted thereon.

SUMMARY

Some embodiments of the inventive concept provide a substrate processing apparatus including a first disk, which is configured to perform a rotating motion, and a second disk, which is equipped to the first disk and is configured to perform a revolving and rotating motion. The substrate processing apparatus is configured to stably support a substrate loaded on the second disk and to stably turn or rotate the second disk.

According to some embodiments of the inventive concept, a substrate processing apparatus may include a first disk provided in a chamber and configured to perform a turning motion, the first disk including a plurality of seating holes periodically arranged within a specific radius from a center axis, a plurality of second disks provided in the seating holes, respectively, and configured to perform a revolving and rotating motion in accordance with the turning motion of the first disk, a first rotary connector structure provided between the second disk and the seating hole to allow for a rotating motion of the second disk and for an electric connection to the second disk, an electrostatic chuck provided on the second disk and configured to hold a substrate using an electric power supplied through the first rotary connector structure, and a first magnetic gear fixed to the second disk and configured to exert a torque on the second disk, and a second magnetic gear provided in the chamber to be interact with the first magnetic gear but prevented from turning.

In some embodiments, the first magnetic gear may include a rotating magnet support plate fixedly coupled with the second disk, the rotating magnet support plate having a circular disk shape, and a plurality of first permanent magnets arranged on a circumference surface of the rotating magnet support plate to have alternating magnetization directions and spaced apart from each other by a specific distance. The second magnetic gear may include a fixed magnet supporting plate provided between a bottom surface of the chamber and the first disk, the fixed magnet supporting plate having a washer or doughnut shape, and a plurality of second permanent magnets arranged on a circumference surface of the fixed magnet supporting plate to have alternating magnetization directions. The first permanent magnet and the second permanent magnet may be configured to exert an attractive force or repulsive force on the second disk, depending on a rotation state of the second disk and thereby to turn the second disk.

In some embodiments, the electrostatic chuck may include an electrostatic chuck body, an electrode seating portion formed in a top surface of the electrostatic chuck body to have a recessed shape, an insulating member filling the electrode seating portion, and a pair of electrostatic electrodes buried in the insulating member.

In some embodiments, each of the pair of electrostatic electrodes may have a semi-circular shape or a concentric washer shape.

In some embodiments, the substrate processing apparatus may further include at least one of: a first disk center axis vertically extending from a center axis of the first disk, a bellows structure provided to surround the first disk center axis and to hermetically seal the first disk center axis in a vacuum manner, the bellows structure extending from a bottom surface of the chamber to an outside of the chamber, a second rotary connector structure provided to pass through the bellows structure and to be axis-coupled with an end of the first disk center axis, the second rotary connector structure being configured to allow for a rotational motion of the first disk center axis and an electric connection to the first disk center axis, and a rotation driving unit configured to rotate the first disk center axis.

In some embodiments, the substrate processing apparatus may further include a magnetic gear vertical moving unit, which is configured to move the second magnetic gear in a direct vertical direction and is used to allow an arrangement plane of the first magnetic gear to be coincident with that of the second magnetic gear. The magnetic gear vertical moving unit may include a magnetic gear vertical driving unit, which is placed outside the chamber and is configured to perform a linear motion, and a connecting rod, which is configured to connect the magnetic gear vertical driving unit to the second magnetic gear.

In some embodiments, the first rotary connector structure may include an upper bearing and a lower bearing spaced apart from each other in a vertical direction, a slip ring body provided between the upper bearing and the lower bearing, a plurality of slip rings arranged on an outer circumference surface of the slip ring body, and a brush electrically connected to the slip ring.

In some embodiments, the electrostatic chuck may include an electrostatic chuck body, an insulating member provided on a top surface of the electrostatic chuck body, the insulating member having a washer or doughnut shape, and an electrostatic electrode provided on a top surface of the insulating member, the electrostatic electrode having a patterned shape.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to some embodiments of the inventive concept, to simultaneously process a plurality of substrates loaded on a rotating substrate holder in a single chamber, it is necessary to revolving and rotating each substrate and to stably control a position of each substrate against a centrifugal force caused by the revolving and rotating motion.

A mechanical chuck may be used to stably fix a substrate, but it is difficult to equip the mechanical chuck to a revolution plate or a first disk, which is configured to perform a turning motion, and/or to a rotation plate or a second disk, which is configured to perform not only a revolving motion but also a rotating motion.

By contrast, an electrostatic chuck may be used to stably fix a substrate, but it is difficult to construct an electric wiring structure in a revolution plate or a first disk, which is configured to perform a turning motion, and/or in a rotation plate or a second disk, which is configured to perform not only a revolving motion but also a rotating motion.

According to some embodiments of the inventive concept, a magnetic gear may be used to allow for a revolving and rotating motion of the second disk, an electrostatic chuck may be provided on the second disk to hold the substrate, and a rotary connector structure may be used to construct an electrical interconnection structure. Accordingly, it may be possible to stably hold the substrate and to rotate the substrate during processing the substrate. As a result, it may be possible to improve process uniformity.

The magnetic gear may be configured to have a plurality of permanent magnets that are arranged to have alternating magnetization directions, instead of saw-teeth of a conventional gear. The magnetic gear may include a main magnetic gear, which is configured to rotate about a center axis, and a plurality of auxiliary magnetic gears, each of which is configured to perform a rotational motion caused by the turning motion of the main magnetic gear. However, a magnetic gear, in which the main magnetic gear and the auxiliary magnetic gears are configured to rotate about their respective center axes, is not suitable for a revolution system.

According to some embodiments of the inventive concept, a rotation plate or a second disk may be provided on a revolution plate or a first disk, and the rotation plate may be configured to perform a revolving and rotating motion in accordance with the turning motion of the revolution plate. Accordingly, to drive a magnetic gear turning the rotation plate, the main magnetic gear or the second magnetic gear may be fixedly provided, without a turning motion, in the chamber, and the auxiliary magnetic gear or the first magnetic gear may be coupled to the rotation plate to perform a rotational motion along with the rotation plate.

According to some embodiments of the inventive concept, in the case where a height of the fixed plate or the first disk is changed to adjust an arrangement plane of the substrate, a height of the auxiliary magnetic gear or the first magnetic gear may be changed. Thus, to drive the magnetic gear, an arrangement plane of the main magnetic gear or the second magnetic gear may be controlled to be coplanar with that of the auxiliary magnetic gear or the first magnetic gear.

To use the electrostatic chuck, it may be necessary to construct an electric interconnection structure between the second disk and the first disk. For this, the revolution plate (or the first disk) and the rotation plate (or the second disk) may be interconnected to each other using a first rotary connector structure, and the revolution plate (or the first disk) may be connected to an external electric power through a second rotary connector structure.

Also, in the case where there is a need to change a process condition, an arrangement plane of the substrate may be changed. In this case, a bellows structure may be used to change an arrangement plane of the revolution plate or the first disk.

Figure 1:
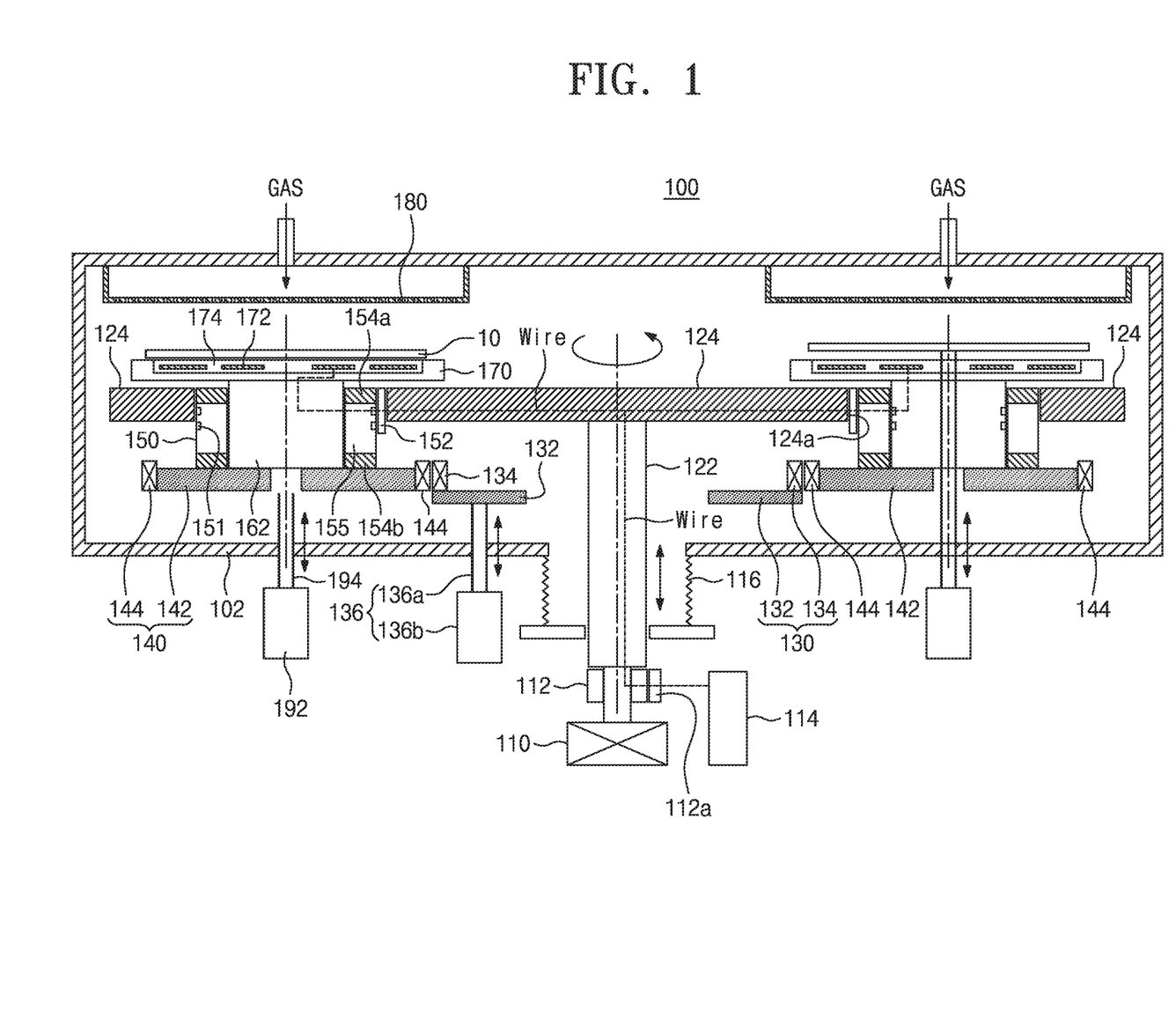
FIG. 1 is a sectional view schematically illustrating a substrate processing apparatus according to some embodiments of the inventive concept.

FIG. 1 is a sectional view schematically illustrating a substrate processing apparatus according to some embodiments of the inventive concept.

Figure 2:
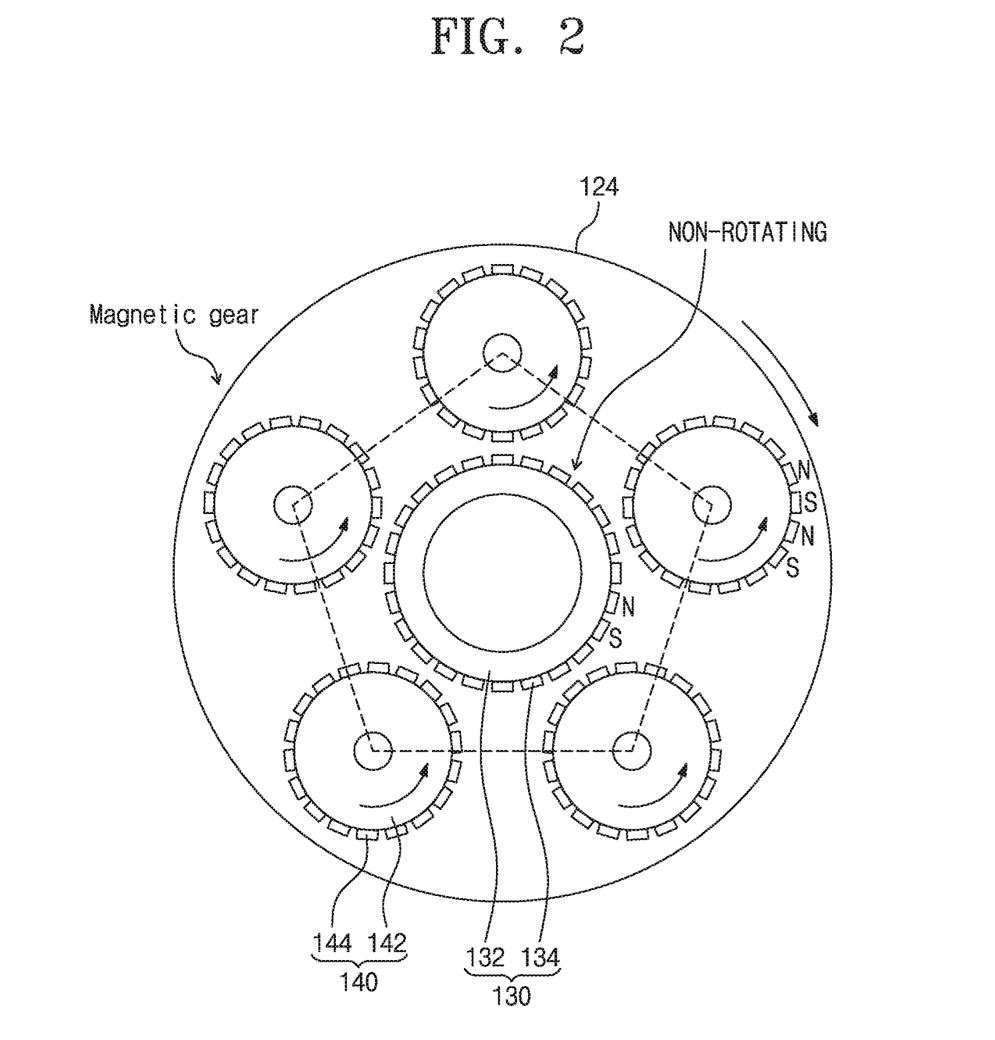
FIG. 2 is a plan view schematically illustrating a magnetic gear of the substrate processing apparatus of FIG. 1.

FIG. 2 is a plan view schematically illustrating a magnetic gear of the substrate processing apparatus of FIG. 1.

Figure 3A:
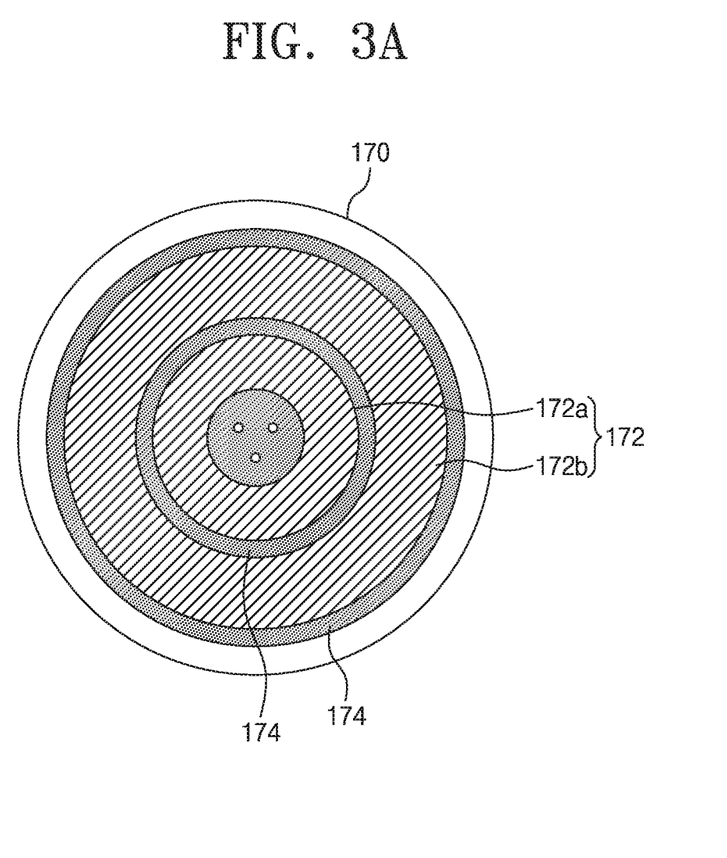
FIG. 3A is a plan view illustrating an electrostatic chuck of FIG. 1.

FIG. 3A is a plan view illustrating an electrostatic chuck of FIG. 1.

Figure 3B:
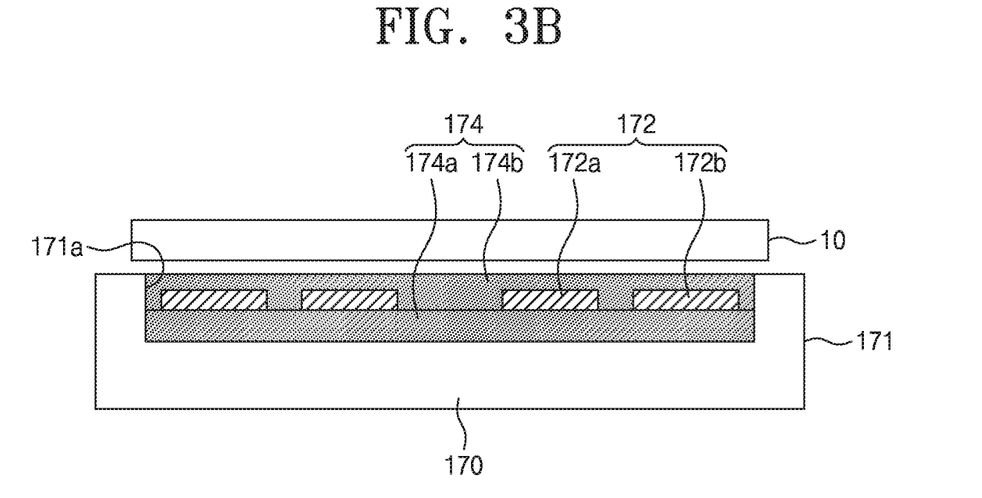
FIG. 3B is a sectional view illustrating the electrostatic chuck of FIG. 3A.

FIG. 3B is a sectional view illustrating the electrostatic chuck of FIG. 3A.

Referring to FIGS. 1, 2, 3A and 3B, a substrate processing apparatus 100, according to some embodiments of the inventive concept, may include a first disk 124, a second disk 162, a first rotary connector structure 150, an electrostatic chuck 170, a first magnetic gear 140, and a second magnetic gear 130. The first disk 124 may include a plurality of seating holes 124a, which are periodically arranged within a specific radius from a center axis of the first disk 124, may be provided in a chamber 102, and may be configured to perform a rotating motion. In some embodiments, a plurality of the second disks 162 may be provided in the seating holes, respectively, and may be configured to perform a revolving and rotating motion in accordance with the rotating motion of the first disk 124. The first rotary connector structure 150 may be provided between the second disk 162 and the seating hole 124a to allow for the rotating motion of the second disk 162 and to allow for an electric connection to the second disk 162. The electrostatic chuck 170 may be configured to hold a substrate using an electric power supplied through the first rotary connector structure 150 and may be provided on the second disk 162. The first magnetic gear 140 may be fixed to the second disk 162 and may be configured to exert a torque on the second disk. The second magnetic gear 130 may be placed in the chamber 102 to be interacted with the first magnetic gear 140 but may be prevented from turning.

The chamber 102 may be a cylindrical chamber. The chamber 102 may be used to perform a thin-film deposition process or a substrate surface treatment process. A gas distribution unit 180 may be provided at an upper portion of an internal space of the chamber 102. The gas distribution unit 180 may be a toroidal structure having a rectangular section. The gas distribution unit 180 may include a plurality of gas injection holes that are formed to penetrate a bottom surface. The gas injection holes may be configured to inject gas onto a substrate 10, when a deposition process is performed.

The first disk 124 may be a circular plate. The first disk 124 may be configured to rotate about its center axis. The first disk 124 may include a plurality of seating holes 124*a* which are arranged along a circumference of a circle with a specific radius and are spaced apart from each other by a same distance. In some embodiments, the number of the seating holes is five. The first disk 124 may have a pathway that is configured to allow a wire to pass therethrough and extends in a radius direction.

The second disk 162 may be placed to be inserted into the seating hole 124*a*. The second disk 162 may perform a revolving motion in accordance with a turning motion of the first disk 124. The second disk 162 may perform a revolving and rotating motion by the magnetic gears 140 and 130. An angular speed of the rotating motion may be determined by a gear ratio of the magnetic gear. The second disk 162 may be a circular disk shape and may be formed of or include at least one of metals, graphite, or quartz.

The first rotary connector structure 150 may be provided to surround the second disk 162 and may be placed to be inserted into the seating hole 124*a*. The first rotary connector structure 150 may include an upper bearing 154*a* and a lower bearing 154*b*, which are spaced apart from each other in a vertical direction; a slip ring body 155, which is provided between the upper bearing and the lower bearing; a plurality of slip rings 151, which are arranged on an outer circumference surface of the slip ring body; and a brush, which is electrically connected to the slip ring 151. The upper bearing 154*a* may be provided to have a top surface that is substantially coplanar with that of the first disk 124, and the lower bearing 154*b* may be provided to have a bottom surface that is substantially coplanar with that of the second disk 162. Each of the upper bearing and the lower bearing may be provided to have a toroidal shape. The slip ring body 155 may be a toroidal structure, which is disposed between the upper bearing and the lower bearing and is electrically isolated or formed of an insulating material, and may be configured to be rotatable. The slip ring 151 may be buried in the slip ring body, may be exposed through the outer circumference surface of the slip ring body, and may be electrically connected to the brush. The brush may be provided on or in the first disk 124 and may be used as an electric connection path to the turning slip ring 151.

The electrostatic chuck 170 may be provided on a top surface of the second disk 162. An electric power may be supplied to the electrostatic chuck 170 through a wire, which is provided to pass through a wire pathway formed in the second disk 162. The electrostatic chuck 170 may be configured to have a wire pathway, and a wire may be provided to pass through the wire pathway and may be electrically connected to an electrode of the electrostatic chuck 170. The electrostatic chuck 170 may include an electrostatic chuck body 171; an electrode seating portion 171*a*, which is formed in a top surface of the electrostatic chuck body and has a recessed shape; an insulating member 174 filling the electrode seating portion 171*a*; and a pair of electrostatic electrodes 172, which are buried in the insulating member. The electrostatic chuck 170 may be configured to serve as a bipolar electrostatic chuck. The electrostatic chuck 170 may have a bottom surface that is higher than the top surface of the first disk 124. The electrode seating portion 171*a* may be a disk shaped region, and top surfaces of the electrostatic chuck body 171 and the electrode seating portion 171*a* may be substantially coplanar with each other. The insulating member 174 may be provided to surround the pair of electrostatic electrodes. A lower insulating member 174*a* provided on a bottom surface of the electrostatic electrode may have a thickness larger than that of an upper insulating member 174*b* provided on a top surface of the electrostatic electrode. The lower insulating member may be formed on the electrostatic chuck body by a spray coating method, and the electrostatic electrode may be coated by a printing method. Thereafter, the electrostatic electrode may be patterned, and then, the upper insulating member may be formed by a spray coating method. According to resistivity of the insulating member 174, the insulating member 174 may provide a Coulomb type electrostatic force or a Jonsen-Rahbek type electrostatic force. The pair of electrostatic electrodes 172 may include first and second electrostatic electrodes 172*a* and 172*b*, each of which has a concentric washer shape. The second electrostatic electrode 172*b* may be provided to surround the first electrostatic electrode 172*a* in a concentric manner, and the first and second electrostatic electrodes 172*a* and 172*b* may be placed on the same plane.

In certain embodiments, the electrostatic electrode 172 may be formed of or include aluminum, and the lower insulating member 174*a* and the upper insulating member 174*b* may be simultaneously formed by an anodizing method.

The electrostatic electrode 172 may include the first and second electrostatic electrodes 172*a* and 172*b*, which are arranged in a concentric manner, and a high DC voltage may be applied between the first and second electrostatic electrodes 172*a* and 172*b*. Accordingly, a substrate may be fixed on the electrostatic chuck 170 by an electrostatic holding force.

A first disk center axis 122 may extend in a direction from the center axis of the first disk 124 toward a bottom surface of the chamber 102. The first disk center axis 122 may have a circular pillar shape and may include a wire pathway allowing a wire to be provided therein. The first disk center axis 122 may be fixedly coupled to the first disk 124.

A bellows structure 116 may be provided to surround the first disk center axis 122. The bellows structure 116 may be configured to hermetically seal the first disk center axis 122 in a vacuum manner and may extend from the bottom surface of the chamber 102 to the outside of the chamber 102. The bellows structure 116 may be provided to pass through a center region of the bottom surface of the chamber 102 and may be configured to perform a vertical motion relative to the first disk center axis 122. A portion of the first disk center axis 122 may be exposed to the outside through the bellows structure 116.

A second rotary connector structure 112 may be axis-coupled with an end of the first disk center axis 122, which is provided to pass through the bellows structure 116, and may be configured to allow for a rotational motion of the first disk center axis 122 and for an electric connection with the first disk center axis 122. The second rotary connector structure 112 may be configured to perform substantially the same function as that of the first rotary connector structure 150. The second rotary connector structure 112 may be configured to allow the first disk center axis 122 to be rotated, and here, a brush, which is connected to an external power 114, may be used to supply an electric power to a wire that is provided in a wire pathway of the first disk center axis 122. The electric power may be supplied to the electrostatic chuck 170 through the first rotary connector structure 150.

A rotation driving unit 110 may be coupled to an end of the first disk center axis 122 and may be used to rotate the first disk center axis 122. The rotation driving unit 110 may be a motor. In the case where the bellows structure 116 is stretched or expanded, the rotation driving unit 110, the second slip ring 112, the first disk center axis 122, and the first disk 124 may be moved in a vertical direction.

The first magnetic gear 140 may be coupled to the bottom surface of the second disk 162 to exert a torque on the second disk 162. The first magnetic gear 140 may include a rotating magnet support plate 142, which is fixedly coupled with the second disk 162 and has a circular disk shape, and a plurality of first permanent magnets 144, which are arranged on a circumference surface of the rotating magnet support plate 142 to have alternating magnetization directions and are spaced apart from each other by a specific distance. The rotating magnet support plate 142 may be a circular plate having a circular disk shape or a washer shape. In some embodiments, a plurality of the first permanent magnets 144 may be fixedly arranged on an outer circumference surface of the rotating magnet support plate 142 to be spaced apart from each other by the same distance. A magnetization direction of the first permanent magnet 144 may be a positive radius direction or a negative radius direction, and the magnetization directions of the first permanent magnets 144 may be alternately changed depending on their angles. The rotating magnet support plate 142 may be formed of or include a dielectric material to reduce power loss caused by an eddy current.

the second magnetic gear 130 may be engaged with the first magnetic gear 140 to exert a torque on the first magnetic gear 140. The second magnetic gear 130 may be provided between the bottom surface of the chamber 102 and the first disk 124 and may include a fixed magnet supporting plate 132 having a washer shape and a plurality of second permanent magnets 134, which are arranged on a circumference surface of the fixed magnet supporting plate to have alternating magnetization directions. The fixed magnet supporting plate 132 may be a washer-shaped circular plate, and an arrangement plane of the fixed magnet supporting plate may be substantially the same as that of the rotating magnet support plate 142. A center axis of the fixed magnet supporting plate 132 may be coincident with that of the first disk 124. To suppress power loss caused by an eddy current, the fixed magnet supporting plate 132 may be formed of or include a dielectric material. A magnetization direction of the second permanent magnet 134 may be a positive radius direction or a negative radius direction. The second permanent magnets 134 may be arranged to be spaced apart from each other with the same distance on an edge circumference surface of the fixed magnet supporting plate 132. The first permanent magnet 144 and the second permanent magnet 134 may be configured to exert an attractive force or repulsive force on the second disk 162, depending on a rotation state of the second disk 162, and the attractive force or repulsive force may be used to allow the second disk 162 to perform a revolving and rotating motion.

In the case where, according to a process condition, the first disk 124 is vertically moved using the bellows structure 116, a magnetic gear vertical moving unit 136 may be used to change a vertical position of the second magnetic gear 130, for the alignment of the magnetic gear.

The magnetic gear vertical moving unit 136 may be configured to move the second magnetic gear 130 in a direct vertical direction and thus may be used to allow an arrangement plane of the first magnetic gear 140 to be coincident with that of the second magnetic gear 130. The magnetic gear vertical moving unit 136 may include a magnetic gear vertical driving unit 136b, which is placed outside the chamber 102 and is configured to perform a linear motion, and a connecting rod 136a, which is configured to connect the magnetic gear vertical driving unit 136b to the second magnetic gear 130.

Each of the electrostatic chuck 170 and the second disk 162 may include at least three vertical through holes. The vertical through holes of the electrostatic chuck 170 and the second disk 162 may be vertically aligned to each other. In the case where the first disk 124 and the second disk 162 are stopped, a lift pin 194 for lifting up the substrate may be inserted through the vertical through hole. A lift pin driving unit 192 may be provided to allow the lift pin 194 to perform a vertically linear motion.

Figure 4A:
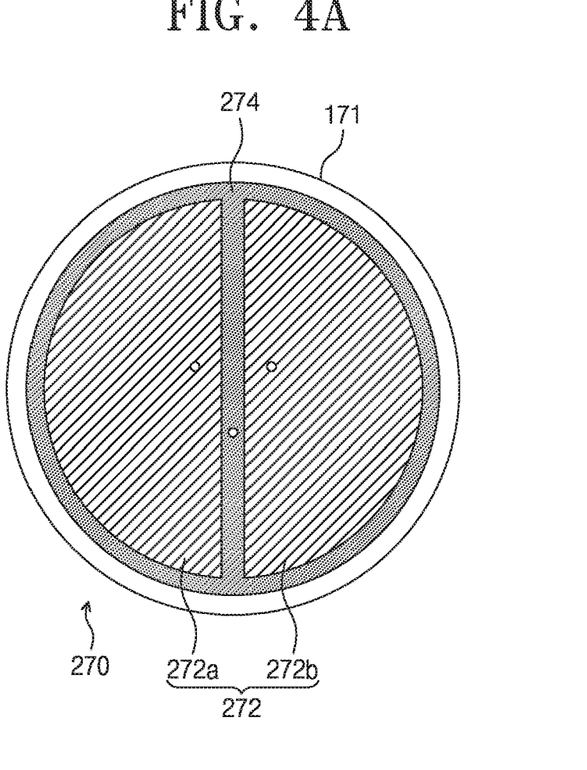
FIG. 4A is a plan view illustrating an electrostatic chuck according to other embodiments of the inventive concept.

FIG. 4A is a plan view illustrating an electrostatic chuck according to other embodiments of the inventive concept.

Figure 4B:
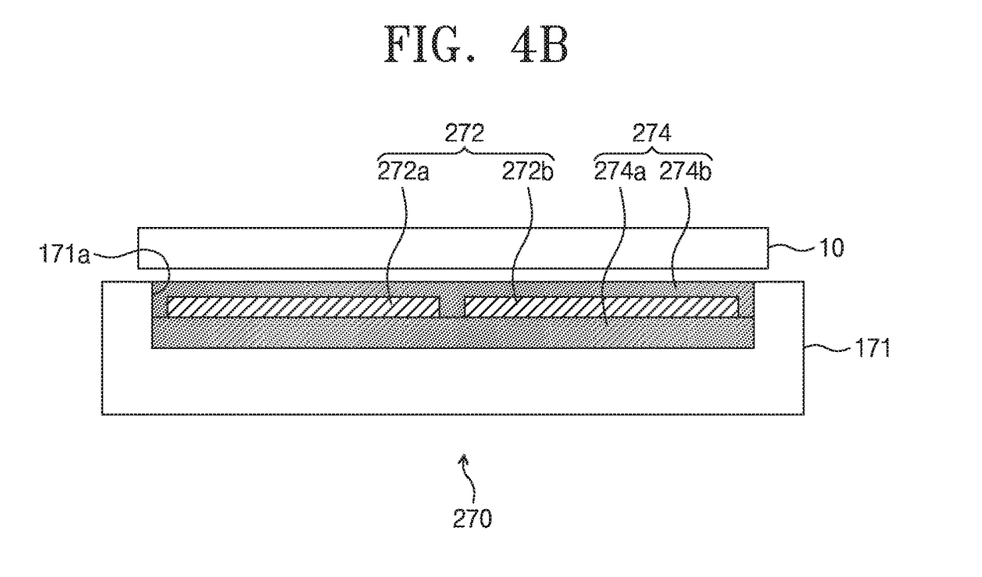
FIG. 4B is a sectional view illustrating the electrostatic chuck of FIG. 4A.

FIG. 4B is a sectional view illustrating the electrostatic chuck of FIG. 4A.

Referring to FIGS. 4A and 4B, an electrostatic chuck 270 may be placed on the top surface of the second disk 162. An electric power may be supplied to the electrostatic chuck 270 through a wire, which is provided to pass through a wire pathway formed in the second disk 162. The electrostatic chuck 270 may be configured to have a wire pathway, and a wire may be provided to pass through the wire pathway and may be electrically connected to an electrode of the electrostatic chuck 270. The electrostatic chuck 270 may include an electrostatic chuck body 171; an electrode seating portion 171a, which is formed in a top surface of the electrostatic chuck body and has a recessed shape; an insulating member 274 filling the electrode seating portion 171a; and a pair of electrostatic electrodes 272, which are buried in the insulating member 274. The electrostatic chuck 270 may be configured to serve as a bipolar electrostatic chuck. The electrostatic chuck 270 may have a bottom surface that is higher than the top surface of the first disk 124. The electrode seating portion 171a may be a disk-shaped region, and top surfaces of the electrostatic chuck body 171 and the electrode seating portion 171a may be substantially coplanar with each other. The insulating member 274 may be provided to surround the pair of electrostatic electrodes 272a and 272b. Each of the pair of electrostatic electrodes 272a and 272b may have a semi-circular shape, and the electrostatic electrodes 272a and 272b may be arranged in such a way that linear portions of the semi-circular shapes face each other.

Figure 5A:
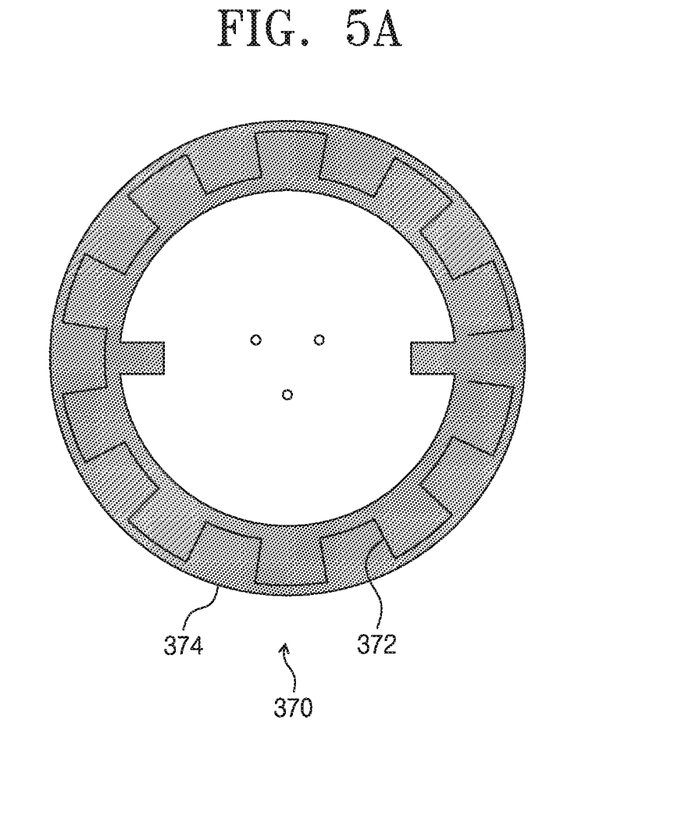
FIG. 5A is a plan view illustrating an electrostatic chuck according to still other embodiments of the inventive concept.

FIG. 5A is a plan view illustrating an electrostatic chuck according to still other embodiments of the inventive concept.

Figure 5B:
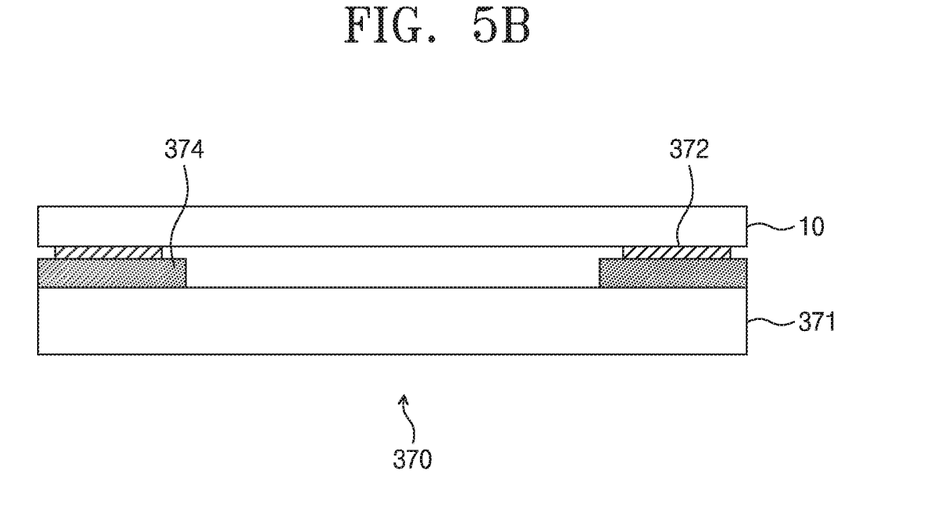
FIG. 5B is a sectional view illustrating the electrostatic chuck of FIG. 5A.

FIG. 5B is a sectional view illustrating the electrostatic chuck of FIG. 5A.

Referring to FIGS. 5A and 5B, an electrostatic chuck 370 may be placed on the top surface of the second disk 162. An electric power may be supplied to an electrostatic electrode 372 of the electrostatic chuck 370 through a wire, which is provided to pass through a wire pathway formed in the second disk 162. The electrostatic chuck 370 may be configured to have a wire pathway, and a wire may be provided to pass through the wire pathway and may be electrically connected to the electrostatic electrode 372 of the electrostatic chuck 370. The electrostatic chuck 370 may include an electrostatic chuck body 371; an insulating member 374, which is provided on a top surface of the electrostatic chuck body 371 and has a washer or doughnut shape; and the electrostatic electrode 372, which is provided on a top surface of the insulating member and has a patterned shape. The electrostatic electrode 372 may be provided between two circles having two different radii (e.g., a first radius and a second radius larger than the first radius) to extend in a wiggled shape in an azimuth direction. The electrostatic electrode 372 may be formed of a conductive material (e.g., tungsten) and may be used as a current path. In some embodiments, the electrostatic electrode 372 may be shaped like a wiggled thin wire.

According to some embodiments of the inventive concept, a substrate processing apparatus may include a first magnetic gear, which is configured to perform a revolving and rotating motion, and a second magnetic gear, which is interacted with the first magnetic gear but is prevented from turning. By using the first and second magnetic gears, it is possible to produce a torque for a rotational motion of a substrate and to prevent a substrate from being deviated by a centrifugal force.

A gear ratio of the magnetic gear may be changed to obtain a desired angular speed. Even when a position of the substrate is changed or an arrangement plane of a first disk in process is changed, an operational property of the magnetic gear can be stably controlled.

While example embodiments of the inventive concepts have been particularly shown and described, it will be understood by one of ordinary skill in the art that variations in form and detail may be made therein without departing from the spirit and scope of the attached claims.

What is claimed is:

1. A substrate processing apparatus, comprising:
   a first disk provided in a chamber and configured to perform a turning motion, the first disk comprising a plurality of seating holes periodically arranged within a specific radius from a center axis;
   a plurality of second disks provided in the plurality of seating holes, respectively, and configured to perform a revolving and rotating motion in accordance with the turning motion of the first disk;
   a first rotary connector structure provided between the plurality of second disks and the plurality of seating holes to allow for a rotating motion of each of the plurality of second disks and for an electric connection to each of the plurality of second disks;
   an electrostatic chuck provided on at least one of the plurality of second disks and configured to hold a substrate using an electric power supplied through the first rotary connector structure; and
   a plurality of first magnetic gears fixed to each of the plurality of second disks, respectively, and configured to exert a torque on each of the plurality of second disks respectively; and
   a second magnetic gear provided in the chamber to interact with the plurality of first magnetic gears, wherein the second magnetic gear is prevented from turning.

2. The substrate processing apparatus of claim 1, wherein each of the plurality of first magnetic gears comprises:
   a rotating magnet support plate fixedly coupled with one of the plurality of second disks, the rotating magnet support plate having a circular disk shape; and
   a plurality of first permanent magnets arranged on a circumference surface of the rotating magnet support plate to have alternating magnetization directions and spaced apart from each other by a specific distance,
   wherein the second magnetic gear comprises:
   a fixed magnet supporting plate provided between a bottom surface of the chamber and the first disk, the fixed magnet supporting plate having a washer or doughnut shape; and
   a plurality of second permanent magnets arranged on a circumference surface of the fixed magnet supporting plate to have alternating magnetization directions,
   wherein the first permanent magnet and the second permanent magnet are configured to exert an attractive force or repulsive force on each of the plurality of second disks, depending on a rotation state of the plurality of second disks and thereby to turn the plurality of second disks.

3. The substrate processing apparatus of claim 1, wherein the electrostatic chuck comprises:
   an electrostatic chuck body;
   an electrode seating portion formed in a top surface of the electrostatic chuck body to have a recessed shape;
   an insulating member filling the electrode seating portion; and
   a pair of electrostatic electrodes buried in the insulating member.

4. The substrate processing apparatus of claim 3, wherein each of the pair of electrostatic electrodes has a semi-circular shape or a concentric washer shape.

5. The substrate processing apparatus of claim 1, further comprising at least one of:
   a first disk center axis vertically extending from a center axis of the first disk;
   a bellows structure provided to surround the first disk center axis and to hermetically seal the first disk center axis in a vacuum manner, the bellows structure extending from a bottom surface of the chamber to an outside of the chamber;
   a second rotary connector structure provided to pass through the bellows structure and to be axis-coupled with an end of the first disk center axis, the second rotary connector structure being configured to allow for a rotational motion of the first disk center axis and an electric connection to the first disk center axis; and
   a rotation driving unit configured to rotate the first disk center axis.

6. The substrate processing apparatus of claim 1, further comprising a magnetic gear vertical moving unit, which is configured to move the second magnetic gear in a direct vertical direction and is used to allow an arrangement plane of the plurality of first magnetic gears to be coincident with that of the second magnetic gear,
   wherein the magnetic gear vertical moving unit comprises:
   a magnetic gear vertical driving unit placed outside the chamber and configured to perform a linear motion; and
   a connecting rod connecting the magnetic gear vertical driving unit to the second magnetic gear.

7. The substrate processing apparatus of claim 1, wherein the first rotary connector structure comprises:
   an upper bearing and a lower bearing spaced apart from each other in a vertical direction;
   a slip ring body provided between the upper bearing and the lower bearing;
   a plurality of slip rings arranged on an outer circumference surface of the slip ring body; and
   a brush electrically connected to the slip ring.

8. The substrate processing apparatus of claim 1, wherein the electrostatic chuck comprises:
   an electrostatic chuck body;
   an insulating member provided on a top surface of the electrostatic chuck body, the insulating member having a washer or doughnut shape; and an electrostatic electrode provided on a top surface of the insulating member, the electrostatic electrode having a patterned shape.

\* \* \* \* \*